(12) United States Patent
Kautzsch et al.

(10) Patent No.: US 10,354,911 B2
(45) Date of Patent: Jul. 16, 2019

(54) SILICON ON NOTHING DEVICES AND METHODS OF FORMATION THEREOF

(71) Applicant: Infineon Technologies Dresden GmbH, Dresden (DE)

(72) Inventors: Thoralf Kautzsch, Dresden (DE); Alessia Scire, Dresden (DE); Steffen Bieselt, Wehlen (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 15/630,579

(22) Filed: Jun. 22, 2017

(65) Prior Publication Data

US 2017/0287772 A1 Oct. 5, 2017

Related U.S. Application Data

(62) Division of application No. 14/819,520, filed on Aug. 6, 2015, now Pat. No. 9,711,393, which is a division of application No. 13/648,170, filed on Oct. 9, 2012, now Pat. No. 9,136,328.

(51) Int. Cl.
| | |
|---|---|
| *H01L 21/764* | (2006.01) |
| *H01L 21/762* | (2006.01) |
| *H01L 27/12* | (2006.01) |
| *H01L 21/324* | (2006.01) |
| *H01L 29/78* | (2006.01) |
| *H01L 29/06* | (2006.01) |
| *B81C 1/00* | (2006.01) |

(52) U.S. Cl.
CPC ........ *H01L 21/764* (2013.01); *B81C 1/00047* (2013.01); *H01L 21/3247* (2013.01); *H01L 21/7624* (2013.01); *H01L 27/1203* (2013.01); *H01L 29/0649* (2013.01); *H01L 29/0653* (2013.01); *H01L 29/7833* (2013.01); *B81B 2203/0315* (2013.01); *B81C 2201/0116* (2013.01)

(58) Field of Classification Search
None
See application file for complete search history.

(56) References Cited

U.S. PATENT DOCUMENTS

| | | | |
|---|---|---|---|
| 6,537,894 B2 | 3/2003 | Skotnicki et al. | |
| 6,800,518 B2 | 10/2004 | Bendernagel et al. | |
| 7,015,147 B2 | 3/2006 | Lee et al. | |

(Continued)

FOREIGN PATENT DOCUMENTS

DE 60127148 T2 12/2007

OTHER PUBLICATIONS

Bethers, U., et al., "Modelling of Surface Diffusion in Structured Silicon," International Scientific Colloquium, Modelling for Material Processing, Riga, Jun. 8-9, 2006, pp. 77-82.

(Continued)

*Primary Examiner* — Daniel Whalen
(74) *Attorney, Agent, or Firm* — Slater Matsil, LLP

(57) ABSTRACT

In accordance with an embodiment of the present invention, a method of forming a semiconductor device includes forming a first cavity within a substrate. The first cavity is disposed under a portion of the substrate. The method further includes forming a first pillar within the first cavity to support the portion of the substrate.

14 Claims, 25 Drawing Sheets

(56) References Cited

U.S. PATENT DOCUMENTS

| | | | |
|---|---|---|---|
| 7,018,882 B2 | | 3/2006 | Tweet et al. |
| 7,045,382 B2 | * | 5/2006 | Benzel ................ B81C 1/00047 |
| | | | 438/422 |
| 7,078,298 B2 | | 7/2006 | Lee et al. |
| 7,906,381 B2 | | 3/2011 | Loubet et al. |
| 8,106,468 B2 | | 1/2012 | Wang et al. |
| 2005/0087843 A1 | | 4/2005 | Benzel et al. |
| 2006/0131651 A1 | * | 6/2006 | Sato ........................ B82Y 20/00 |
| | | | 257/347 |
| 2006/0280342 A1 | | 9/2006 | Choi et al. |
| 2007/0020876 A1 | | 1/2007 | Blomiley et al. |
| 2007/0194353 A1 | | 8/2007 | Snyder |
| 2009/0294842 A1 | | 12/2009 | Juengling |
| 2010/0013015 A1 | | 1/2010 | Snyder |
| 2012/0094456 A1 | | 4/2012 | Wang et al. |

OTHER PUBLICATIONS

Jurczak, M., et al., "Silicon-on-Nothing (SON)—an Innovative Process for Advanced CMOS," IEEE Transactions on Electron Devices, vol. 47, No. 11, Nov. 2000, 9 pages.

Mizushima, I., et al., "Empty-space-in-silicon technique for fabricating a silicon-on-nothing structure," Applied Physics Letters, vol. 77, No. 20, Nov. 13, 2000, pp. 3290-3292.

Pretet, J., et al., "Silicon-on-Nothing MOSFETs: Performance, Short-Channel Effects, and Backgate Coupling," IEEE Transactions on Electron Devices, vol. 51, No. 2, Feb. 2004, 1 page.

Skotnicki, T., "Silicon on Nothing (SON) Fabrication, Material and Devices," ST Microelectronics, Crolles, France, downloaded Jan. 9, 2013, 1 page.

\* cited by examiner

US 10,354,911 B2

SILICON ON NOTHING DEVICES AND METHODS OF FORMATION THEREOF

CROSS-REFERENCE TO RELATED APPLICATIONS

This application is a divisional application of U.S. application Ser. No. 14/819,520 filed on Aug. 6, 2015, which is a divisional of U.S. application Ser. No. 13/648,170 filed on Oct. 9, 2012, now issued as U.S. Pat. No. 9,136,328 on Sep. 15, 2015, which applications are hereby incorporated herein by reference.

TECHNICAL FIELD

The present invention relates generally to semiconductor devices and more particularly to silicon on nothing devices and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits. Thus large number of device regions may be formed within each integrated circuit.

Silicon on nothing (SON) is an emerging technology that may have many applications. In silicon on nothing (SON), regions of silicon are isolated from other regions by a void or an air gap. However, larger voids may not be stable and may be susceptible to deformation during product lifetime or during subsequent fabrication, packaging, and/or testing processes. Any uncoordinated change in the configuration of these voids may result in degraded reliability due to product failure and/or device drift. The ability to form stable voids may enable the creation of many different types of devices including stress enhanced CMOS devices and micro-electromechanical system devices.

SUMMARY

In accordance with an embodiment of the present invention, a method of forming a semiconductor device comprises forming a first cavity within a substrate. The first cavity is disposed under a portion of the substrate. The method further comprises forming a first pillar within the first cavity to support the portion of the substrate.

In accordance with an alternative embodiment of the present invention, a method of forming a semiconductor device comprises providing a pattern having a plurality of lines intersecting at a plurality of vertices, and forming a plurality of openings in a substrate. The plurality of openings is arranged along the plurality of lines of the pattern. The method further comprises transforming the plurality of openings into a cavity supported by a plurality of pillars. The plurality of pillars is formed at the plurality of vertices of the pattern.

In accordance with an alternative embodiment of the present invention, a method of forming a semiconductor device comprises forming a first region having a plurality of openings in a substrate, and forming a second region within the first region. The second region has no opening of the plurality of openings. The method further comprises annealing the substrate to form a cavity at the first region, the cavity supported by pillars at the second region.

In accordance with an alternative embodiment of the present invention, a semiconductor device comprises a first cavity disposed within a substrate and under a portion of the substrate, and a first pillar configured to support the portion of the substrate.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor device in accordance with an embodiment of the invention, wherein FIG. 1A is a perspective view, wherein FIG. 1B is a cross-sectional view, and wherein FIG. 1C is a sectional top view;

FIG. 2, which includes

FIG. 3, which includes FIGS. 3A-3B, illustrates a semiconductor structure having a plurality of multi-level cavities in accordance with an alternative embodiment of the invention, wherein FIG. 3A illustrates a cross-sectional view and FIG. 3B illustrates a top view;

FIG. 4, which includes FIG. 4A-4B, illustrates a semiconductor structure before forming openings in the semiconductor substrate in accordance with an embodiment of the present invention, wherein FIG. 4A illustrates a magnified cross-sectional view while FIG. 4B illustrates a top view of a mask layout (or mask) used for forming the pillars;

FIG. 5, which includes FIG. 5A-5B, illustrates a semiconductor structure after forming openings in the semiconductor substrate in accordance with an embodiment of the present invention, wherein FIG. 5A illustrates a magnified cross-sectional view while FIG. 5B illustrates a top view;

FIG. 6, which includes FIG. 6A-6B, illustrates a semiconductor structure after forming openings and removing the resist layers in the semiconductor substrate in accordance with an embodiment of the present invention, wherein FIG. 6A illustrates a magnified cross-sectional view while FIG. 6B illustrates a top view;

FIG. 8, which includes FIGS. 8A-8C, illustrates a semiconductor structure after annealing in accordance with an embodiment of the present invention, wherein FIGS. 8A and 8B illustrate magnified cross-sectional views while FIG. 8C illustrates a top view;

FIG. 13, which includes FIGS. 13A-13D, illustrates a semiconductor cavity having pillars with a dielectric liner in accordance with an alternative embodiment of the present invention, wherein FIGS. 13A and 13C illustrate a cross-sectional view and FIGS. 13B and 13D illustrate a top view;

FIG. 15, which includes FIGS. 15A and 15B, illustrates a semiconductor structure having pillars supporting the cavity and a further trench opening around the cavity so as to separate the substrate portion above the cavity in accordance with an alternative embodiment of the present invention, wherein FIG. 15A illustrates a cross-sectional view and FIG. 15B illustrates a top view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of the present invention of a mechanically stabilized void will be described using FIG. 1. Further structural embodiments will be described using FIGS. 2, 3, and 13-14. A method of fabricating the semiconductor device having a stabilized void will be described using FIGS. 4-8. An alternative embodiment of fabricating the semiconductor device having multi-level stabilized voids will be described using FIGS. 9-11.

Figure 1A:
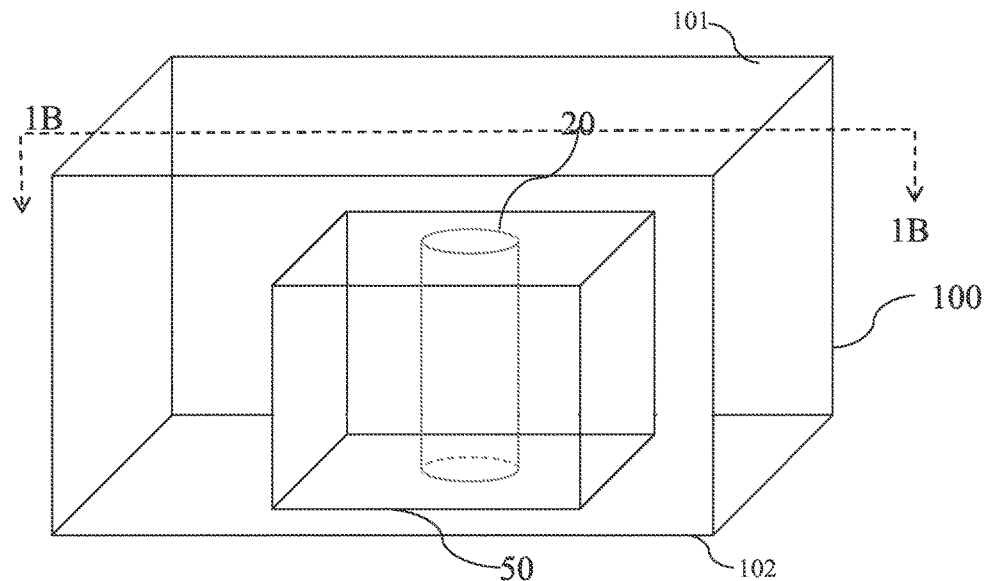
Figure 1B:
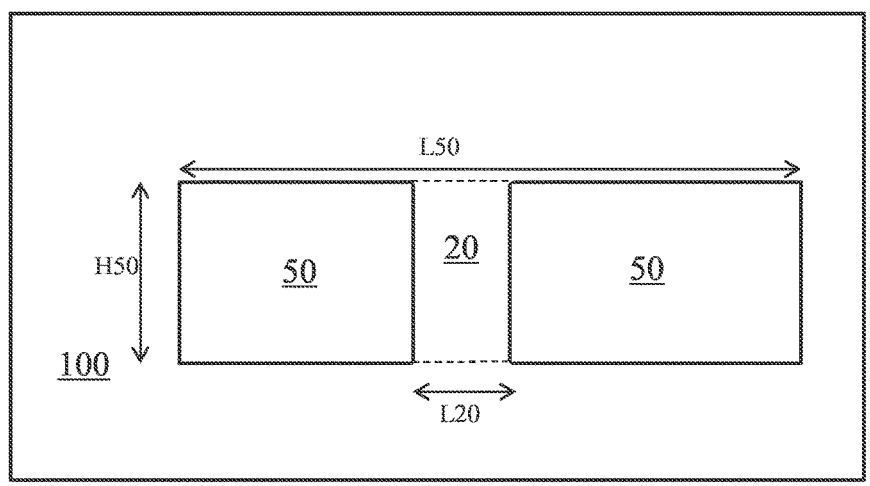
Figure 1C:
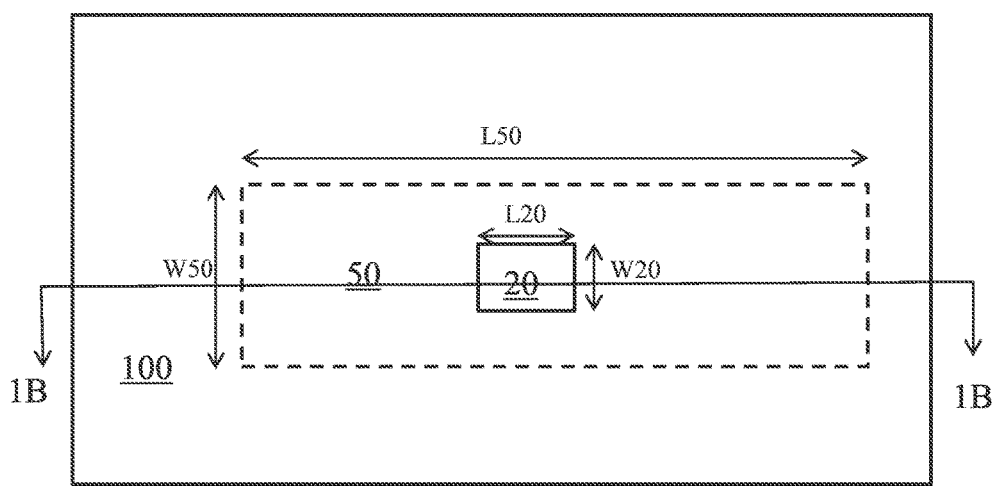

FIG. 1, which includes FIGS. 1A-1C, illustrates a semiconductor device in accordance with an embodiment of the invention, wherein FIG. 1A is a perspective view, wherein FIG. 1B is a cross-sectional view, and wherein FIG. 1C is a sectional top view.

Referring to FIG. 1A, a cavity 50 is disposed within a substrate 100. The substrate 100 has a top surface 101 and an opposite bottom surface 102. The substrate 100 comprises a semiconductor material and may comprise silicon in one embodiment. In other embodiments, the substrate 100 may comprise other semiconductor materials such as silicon germanium, germanium, silicon carbide, gallium nitride, gallium arsenide, and others.

A pillar 20 is formed within the cavity 50. The pillar 20 connects the ceiling of the cavity 50 with the floor of the cavity 50. The pillar 20 acts like a load bearing beam for the cavity 50 and prevents the cavity 50 from collapsing during product use and during further processing, e.g., due to mechanical stress.

FIG. 1B illustrates a cross-sectional view of the substrate illustrating the pillar.

Referring to FIG. 1B, the pillar 20 has a height similar to the height of the cavity H50 because the pillar 20 is connected between the floor and the ceiling of the cavity 50. However, as illustrated in FIG. 1B, the pillar 20 has a much smaller cross sectional length L20 than a length of the cavity L50 (see also FIG. 1C). In various embodiments, the ratio of the length of the pillar 20 (L20) to the length of the cavity 50 (L50) is about 1:10 to about 1:100, and about 1:50 in one embodiment.

FIG. 1C illustrates a top sectional view of the cavity in accordance with an embodiment of the invention.

Referring to FIG. 1C, the pillar 20 has a width W20 much smaller than the width of the cavity 50 (W50). In various embodiments, the ratio of the width of the pillar 20 (W20) to the width of the cavity 50 (W50) is about 1:10 to about 1:100, and about 1:50 in one embodiment.

FIG. 2, which includes FIGS. 2A-2E, illustrates a top view of the cavity having a plurality of pillars in accordance with alternate embodiments of the present invention.

In various embodiments, the cavity 50 may be supported using more than one pillar 20. For example, in various embodiments, a plurality of pillars 20 may support the cavity 50. The plurality of pillars 20 may be arranged in different patterns in one or more embodiments. In various embodiments, the number of pillars, the dimensions of the pillars, and the arrangement of the pillars may be optimized to, for example, stabilize the structure. A finite element modeling software tool may be used to identify the configuration of the pillars 20. Besides the stress tensor, the analysis may utilize parameters such as stress intensity factors, strain energy, critical resolved shear stress, and other variables to identify the appropriate configuration of the pillars 20. Alternatively, the configuration of the pillars 20 may be identified using empirical data.

Figure 2A:
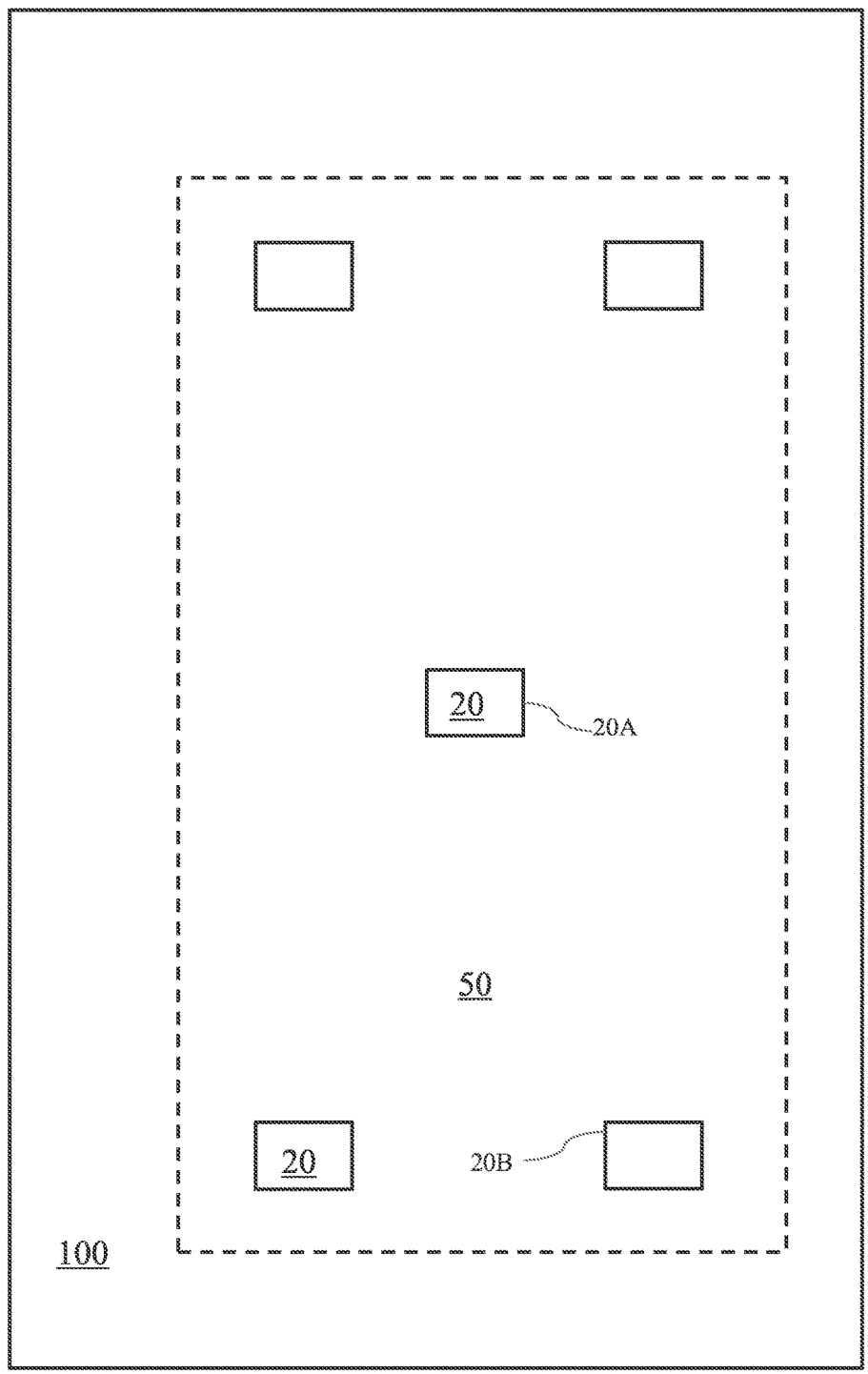
FIGS. 2A-2E, illustrates a top view of the cavity having a plurality of pillars in accordance with alternate embodiments of the present invention.

FIG. 2A illustrates one embodiment of the invention illustrating a central pillar surrounded by a plurality of corner pillars.

Referring to FIG. 2A, the cavity 50 is supported by a central pillar 20A, and a plurality of secondary pillars 20B. The arrangement of the plurality of secondary pillars 20B may depend on the shape of the cavity 50, for example. In some embodiments, the central pillar 20A may be optional.

Figure 2B:
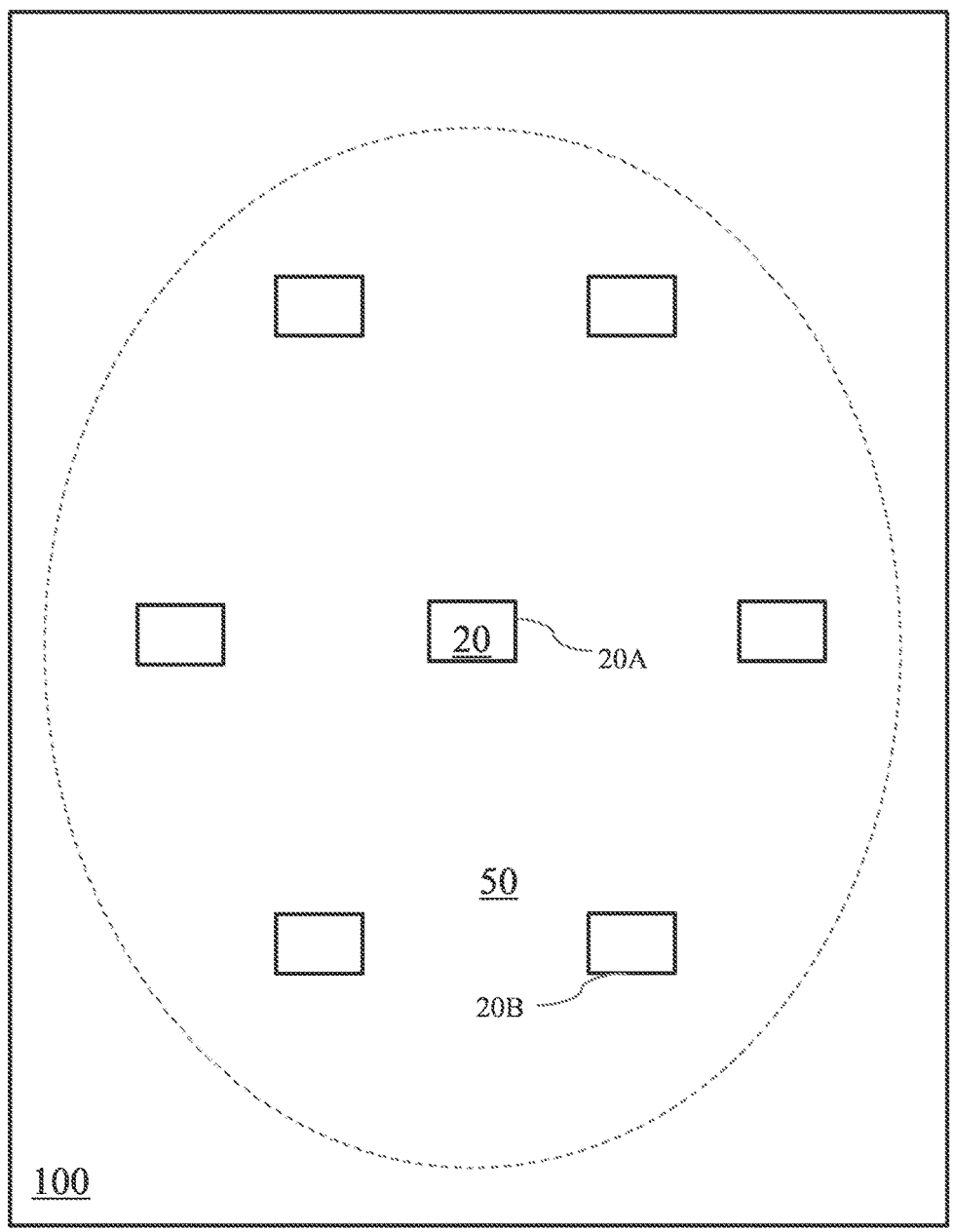

FIG. 2B illustrates another embodiment of the invention illustrating a central pillar surrounded by a plurality of corner pillars.

This embodiment illustrates an alternative shape of the cavity 50. As in the prior embodiment, the pillars 20 comprises a central pillar 20A and a plurality of secondary pillars 20B surrounding the central pillar 20A. Again, the central pillar 20A is optional and may be skipped in some embodiments.

Figure 2C:
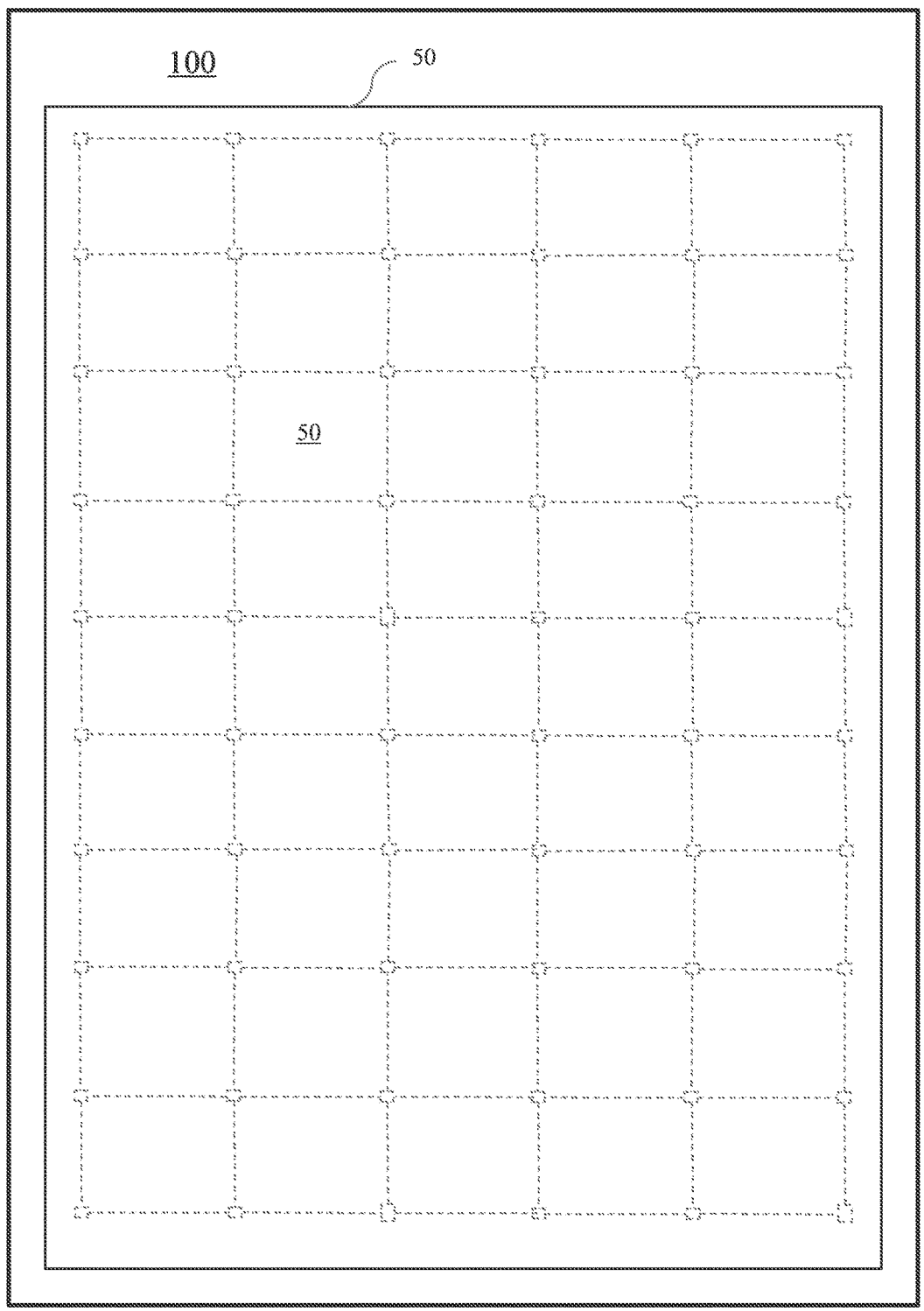

FIG. 2C illustrates another embodiment of the invention illustrating a pattern of pillars supporting a single cavity.

In this embodiment, a large network of pillars 20 supports a cavity 50 from deformation and/or collapse. The pillars 20 may be arranged in a rectangular array in one embodiment.

Figure 2D:
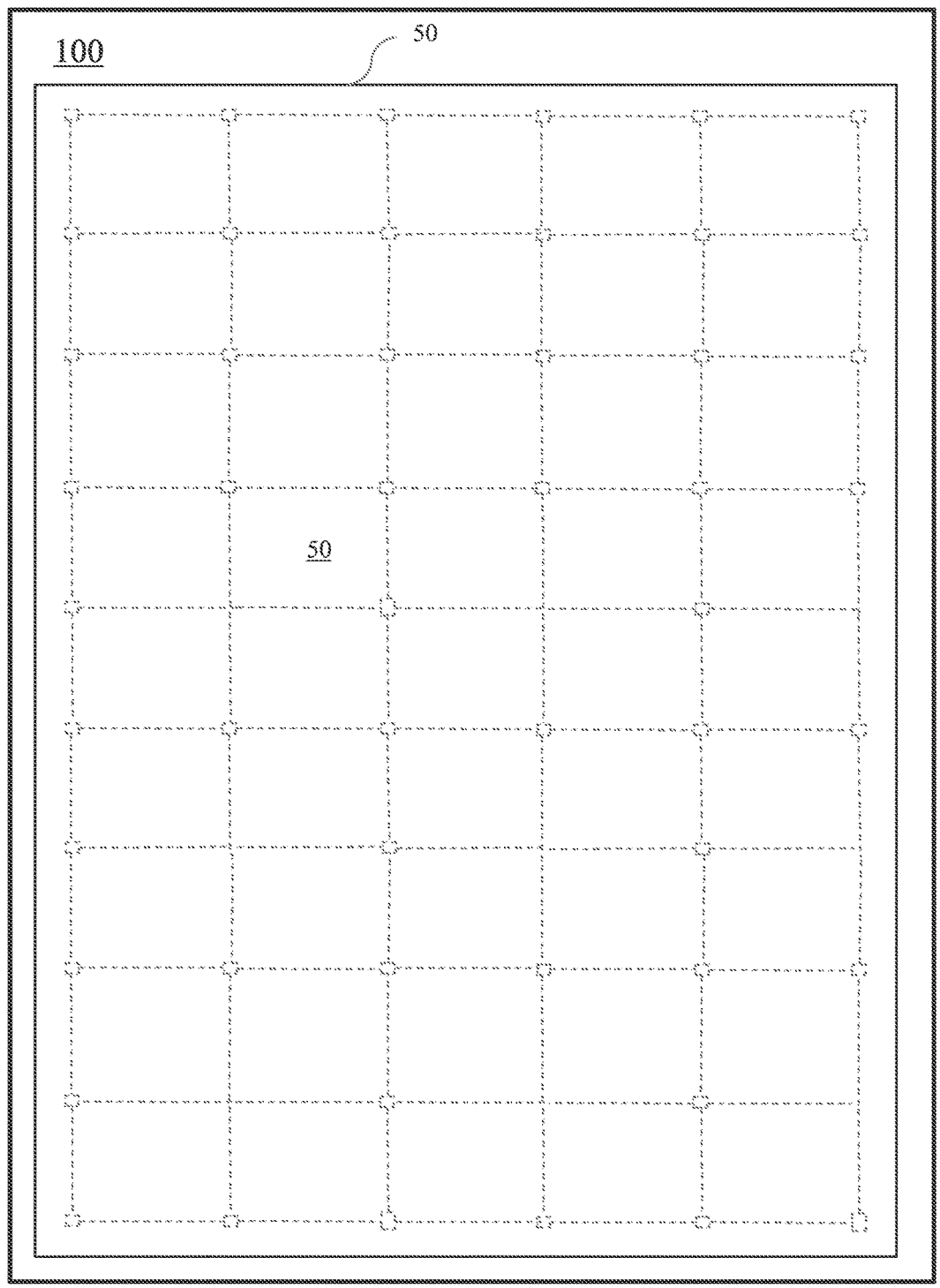

FIG. 2D illustrates another embodiment of the invention illustrating a pattern of pillars supporting a single cavity.

This embodiment is similar to the prior embodiment. Further, this embodiment illustrates a different pattern in arranging the pillars 20 within the cavity 50. In this embodiment, some of the pillars from the prior embodiment are removed without significantly degrading the mechanical stability and reliability of the cavity.

Figure 2E:
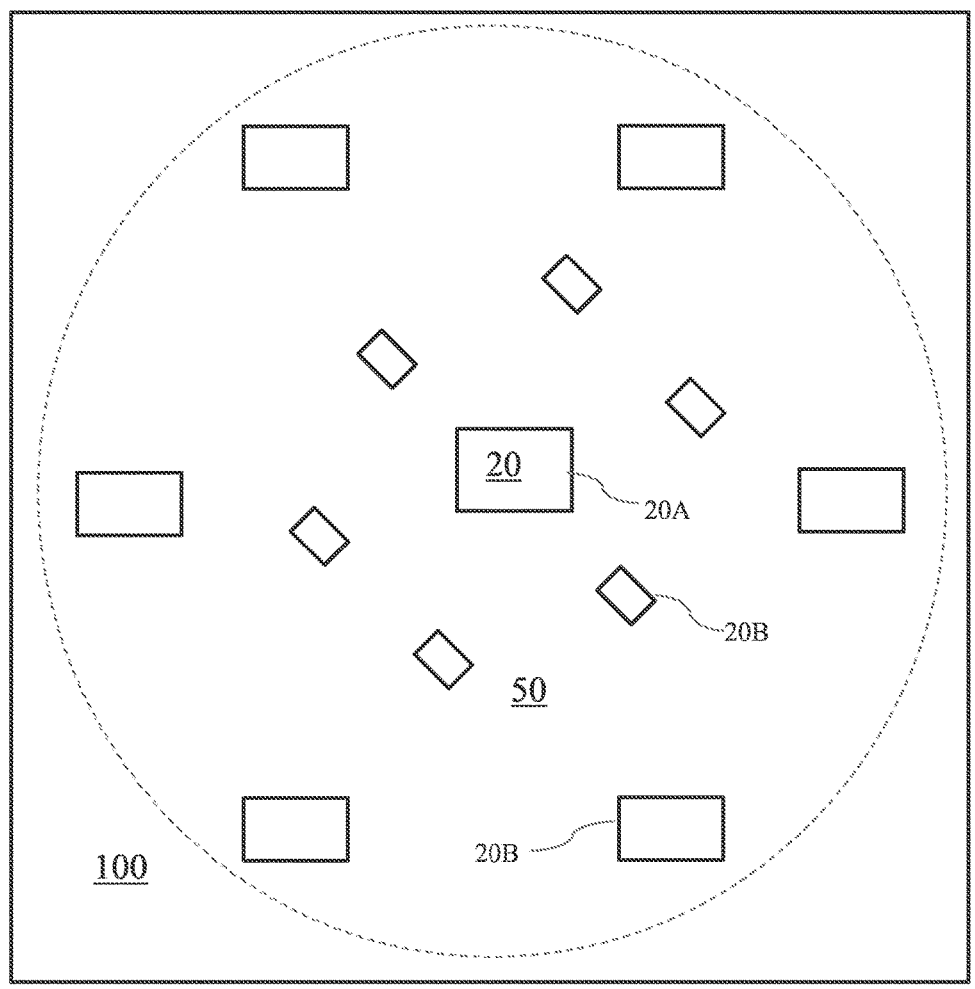

FIG. 2E illustrates another embodiment of the invention illustrating a pattern of pillars supporting a single cavity.

In this embodiment, at least one of the pillars has a different size than the remaining pillars. For example, the central load bearing pillar such as the central pillar 20A may be larger in length, width, or both than the other secondary pillars 20B.

Figure 3A:
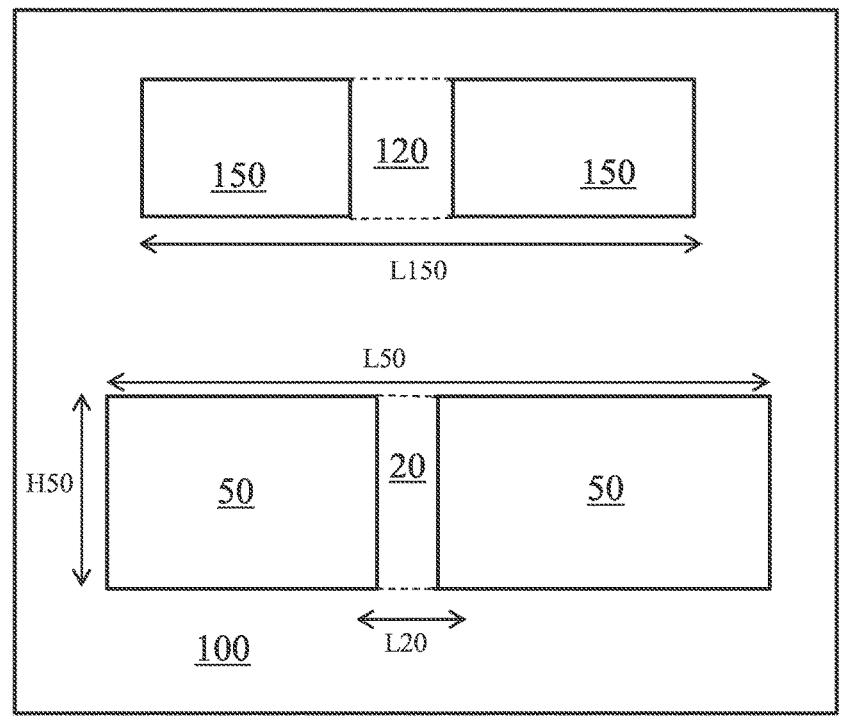
Figure 3B:
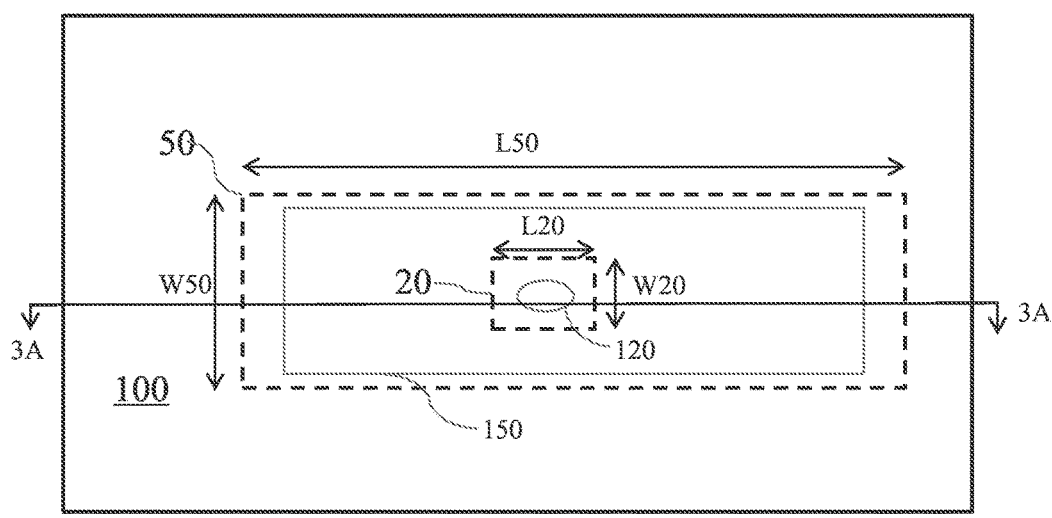

FIG. 3, which includes FIGS. 3A-3B, illustrates a semiconductor structure having a plurality of multi-level cavities in accordance with an alternative embodiment of the invention. FIG. 3A illustrates a cross-sectional view and FIG. 3B illustrates a top view.

Multi-level cavities may be realized using embodiments of the present invention because of the improved mechanical stability enabled by the use of pillars. FIG. 3 illustrates one such embodiment having two levels of cavities formed therein. However, more than two levels of cavities may be formed one above the other using the different arrangements and sizes of the pillars described in various embodiments of the invention.

Referring to FIG. 3A, the cavity 50 is formed within the substrate 100 having one or more pillars such as the pillar 20 described in prior embodiments. The second cavity 150 is formed over the cavity 50. The second cavity 150 may also include one or more pillars such as a second pillar 120. Alternatively in some embodiments, the second cavity 150 may not include pillars, for example, when the second cavity 150 is smaller than the cavity 50 so that the second cavity 150 may not require additional structures for mechanical stability.

As illustrated, in one embodiment, the length of the second cavity 150 (L150) may be smaller than the length of the cavity 50 (L50). As further illustrated in FIG. 3B, in one embodiment, the second pillar 120 may be smaller than the pillar 20 of the lower level cavity 50. In the absence of the pillar stabilized structure of the cavity 50, the formation of the higher level structure such as the second cavity 150 may result in the deformation and/or collapse of the cavity 50.

Accordingly, embodiments of the invention enable formation of complex hierarchical cavity structures.

FIGS. 4-8 illustrates the formation of a semiconductor structure with a pillar stabilized cavity during various stages of fabrication in accordance with embodiments of the present invention.

Figure 4A:
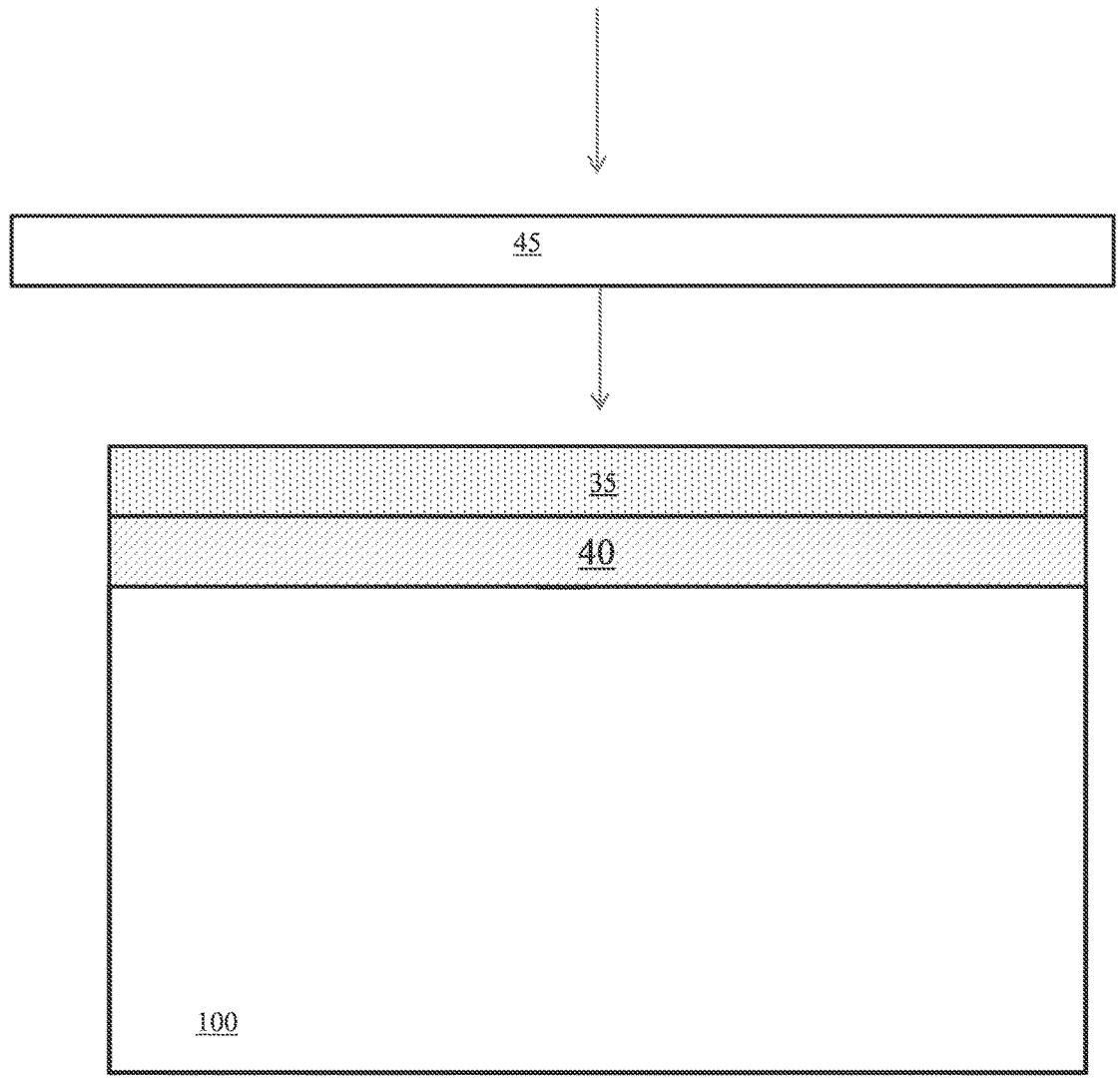
Figure 4B:
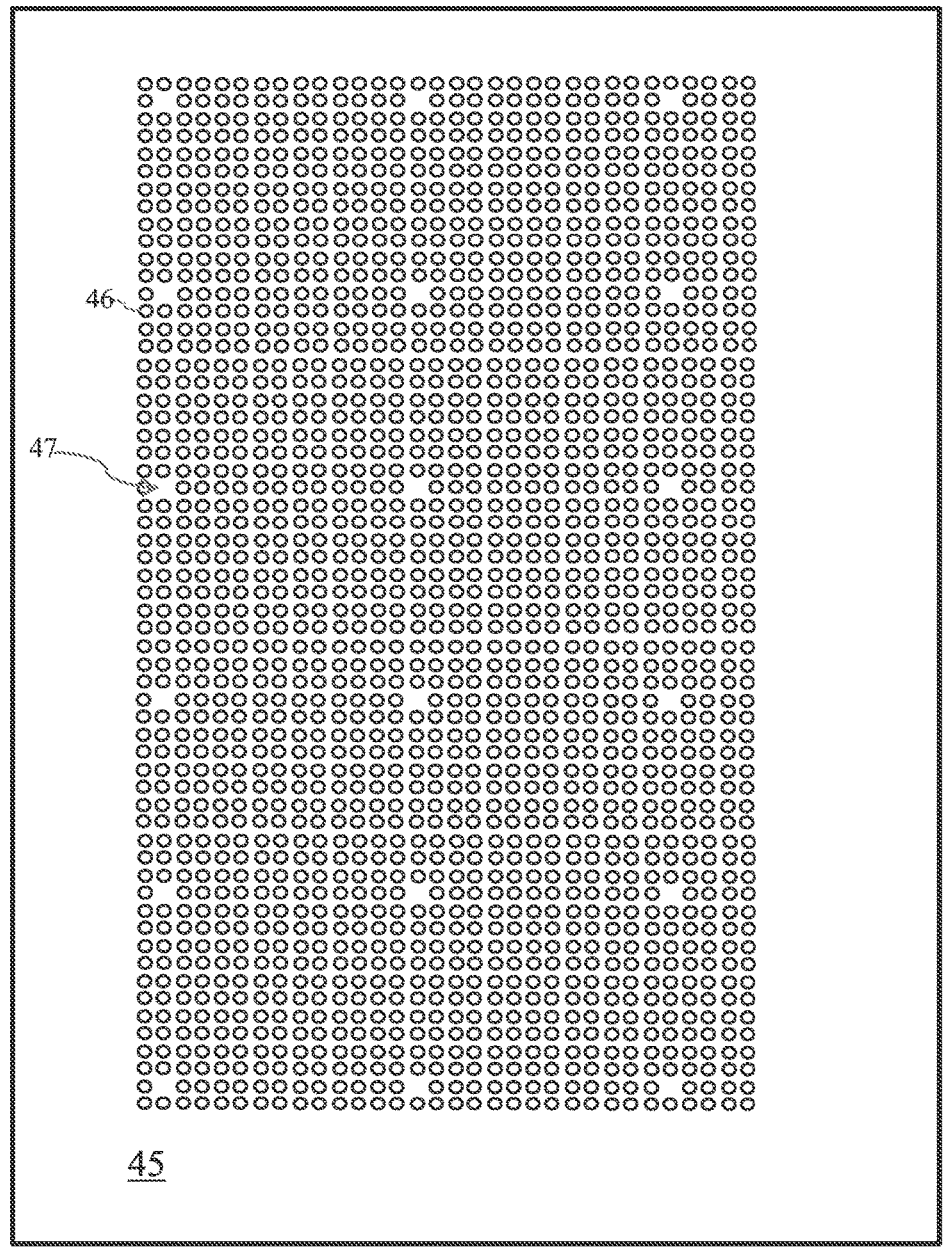

FIG. 4, which includes FIG. 4A-4B, illustrates a semiconductor structure before forming openings in the semiconductor substrate in accordance with an embodiment of the present invention. FIG. 4A illustrates a magnified cross-sectional view while FIG. 4B illustrates a top view of a mask layout (or mask) used for forming the pillars.

Referring to FIG. 4A, a resist layer 40 is formed over a substrate 100. The substrate 100 is a semiconductor substrate in various embodiments. In one or more embodiments, the substrate 100 is a silicon wafer. In one embodiment, the substrate is the bulk silicon wafer. In alternative embodiments, the substrate comprises a wafer comprising silicon germanium, silicon carbide, germanium, and compound semiconductors such as gallium arsenide, gallium nitride, indium arsenide, indium phosphide, indium antimonide, and others.

The resist layer 40 may be deposited in one embodiment. The resist layer 40 may be either organic or inorganic. Some examples of inorganic resist layer 40 include silicon dioxide, silicon nitride, silicon oxy-nitride, titanium nitride and/or a SILK (silicon-containing low-k) layer. The resist layer 40 may also be an organic layer such as a bottom anti-reflective coating (BARC) layer (such as polymides, and polysulfones), a FLARE layer, and/or a BCB layer. The resist layer 40 may optionally be baked to form a hard baked, thermally or chemically cross-linked resist. Finally, although only a single layer of resist is shown, the resist layer 40 may comprise multiple layers. For example, in some embodiments, the resist layer 40 may be a bilayer or trilayer film comprising different materials.

The resist layer 40 protects the underlying substrate 100 during the subsequent through trench etch process. The material of the resist layer 40 may be selected based on the selectivity to the etch chemistry of the through trench etch process. For example, in one embodiment, a high density plasma with a fluorine chemistry may be subsequently used to etch the substrate 100, and the resist layer 40 comprises a $SiO_2$ hard mask.

A photoresist layer 35 may be deposited over the resist layer 40. The photoresist layer 35 is a resist that can be developed by exposure to radiation such as deep UV radiation used by lithography systems. The photoresist layer 35 may be either a positive or a negative photoresist. Examples of photoresist polymers are poly-p-hydroxystyrene, acrylates, novolak or cycloaliphatic copolymers.

Referring to FIG. 4A, the photoresist layer 35 is exposed using a mask 45 having features for the openings 10. The mask 45 may be any type of mask such as phase shift mask, binary mask, and others in various embodiments.

FIG. 4B illustrates a top view showing the mask 45 having a first feature 46 for forming openings (described below in FIG. 5). As illustrated, the first features 46 are absent in regular intervals forming a second feature 47. The second pattern 47 is configured to form the pillars as will be described below in various embodiments.

The first features 46 are arranged in a first pattern. The second features 47 are arranged in a second pattern that includes the first pattern. Thus, in some embodiments, the second features 47 are arranged after a certain number of the first features 46 in regular intervals. In one embodiment, the first features 46 comprise transparent regions while the second features 47 comprise opaque regions.

Figure 5A:
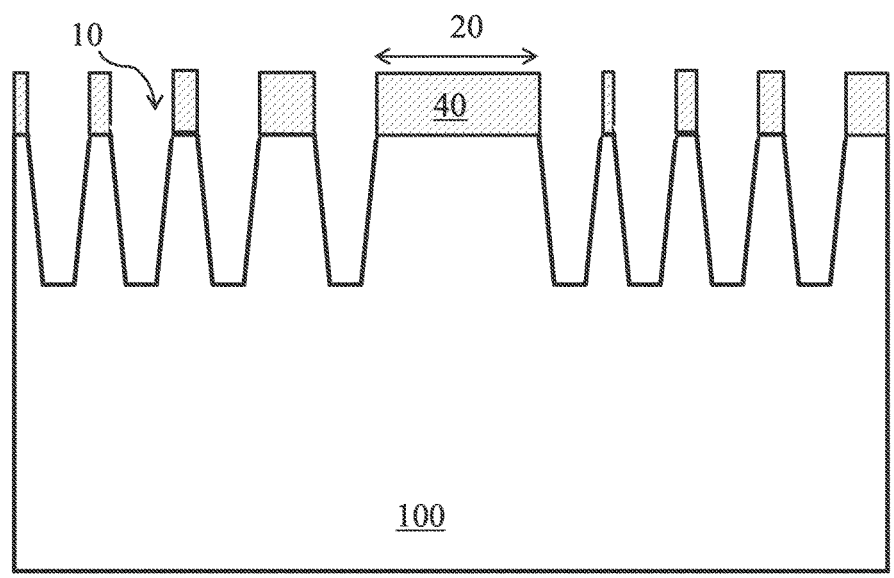
Figure 5B:
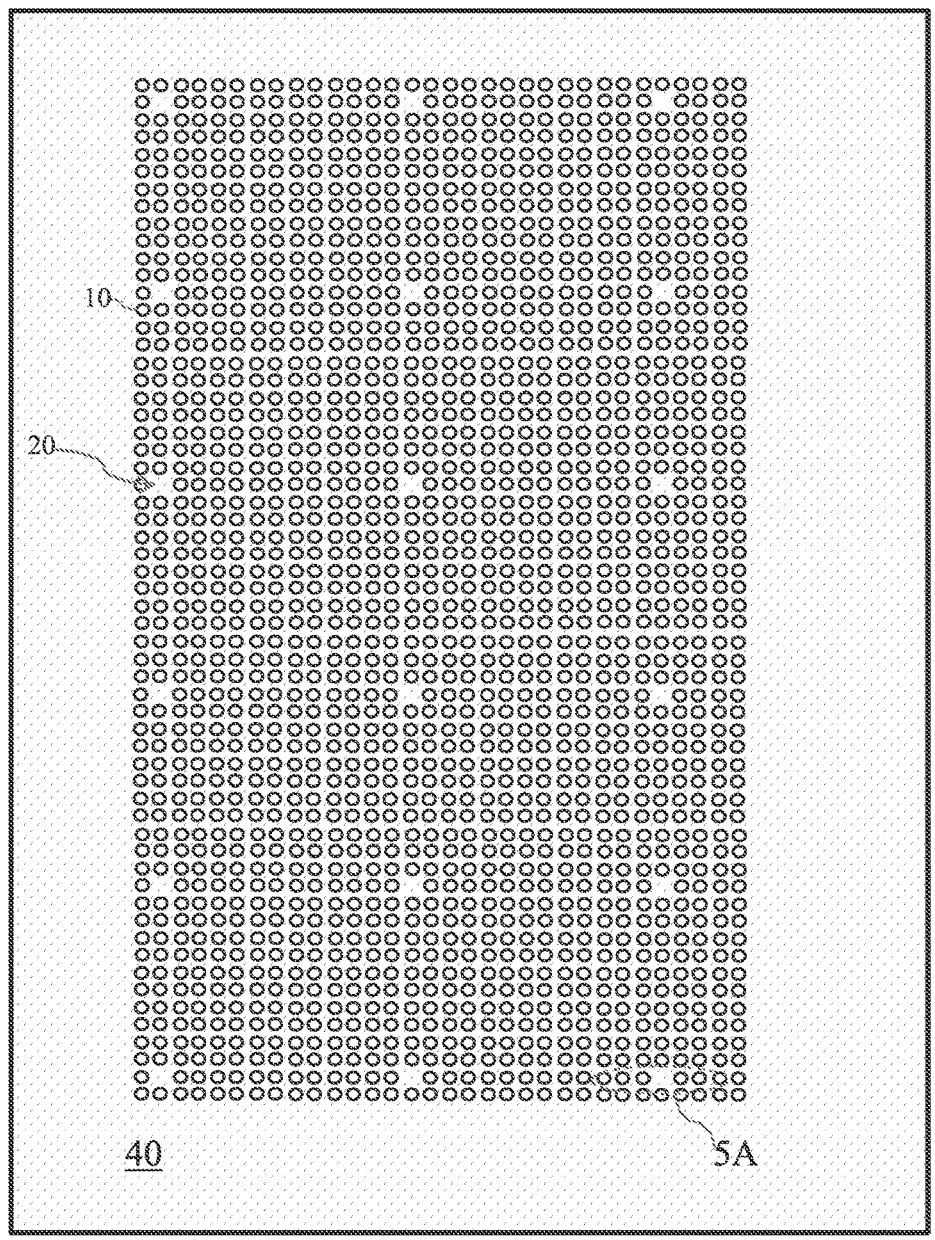

FIG. 5, which includes FIG. 5A-5B, illustrates a semiconductor structure after forming openings in the semiconductor substrate in accordance with an embodiment of the present invention. FIG. 5A illustrates a magnified cross-sectional view while FIG. 5B illustrates a top view.

The photoresist layer 35 is developed and the exposed photoresist regions are removed by etching. Using the remaining photo-resist regions as patterns, an anisotropic etch is used to remove the exposed portion of the resist layer 40 and the exposed underlying substrate 100. In one embodiment, a reactive ion etch process may be used to form the openings 10.

In various embodiments, the openings 10 may have a depth (height) of at least 1 μm. In one or more embodiments, the openings 10 may have a depth of about 1 μm to about 10 μm. The distance between adjacent openings 10 is about 0.1 μm to about 1 μm in various embodiments. In one embodiment, the distance between adjacent openings 10 is about 0.5 μm.

In various embodiments, the openings 10 have a length of about 0.1 μm to about 1 μm and a width of about 0.1 μm to about 1 μm. In various embodiments, the openings 10 are trench like structures, for example, having a length greater than the width or vice versa. In various embodiments, a large number of the openings 10 are formed simultaneously in a single region for forming the cavity. In one or more embodiments, the number of openings 10 may be about 10,000 to about 1,000,000 depending on the size of the cavity being created.

FIG. 5B illustrates a top view showing the resist layer 40 having a plurality of openings 10. As illustrated, the openings 10 are absent in regular intervals forming a pattern. The regions of the resist layer 40 without the openings 10 form the pillars as described in various embodiments.

Figure 6A:
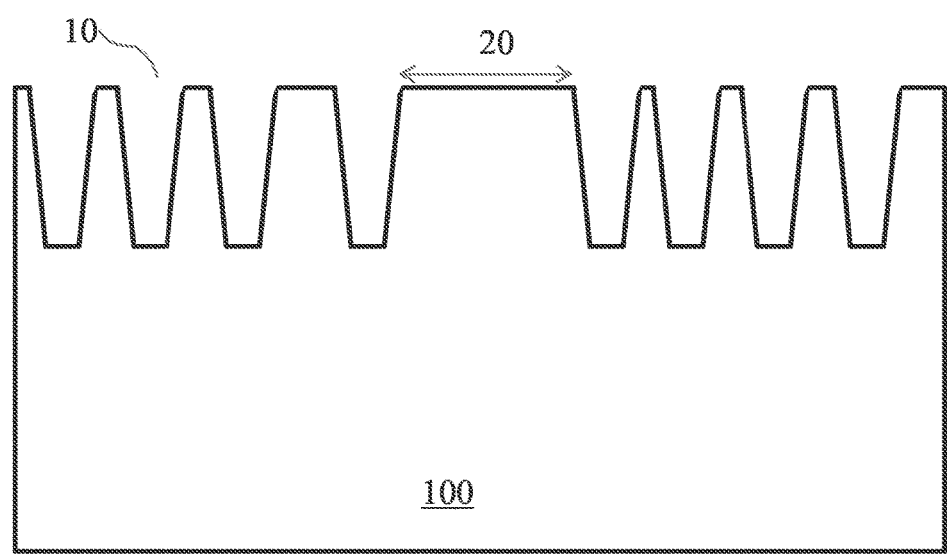
Figure 6B:
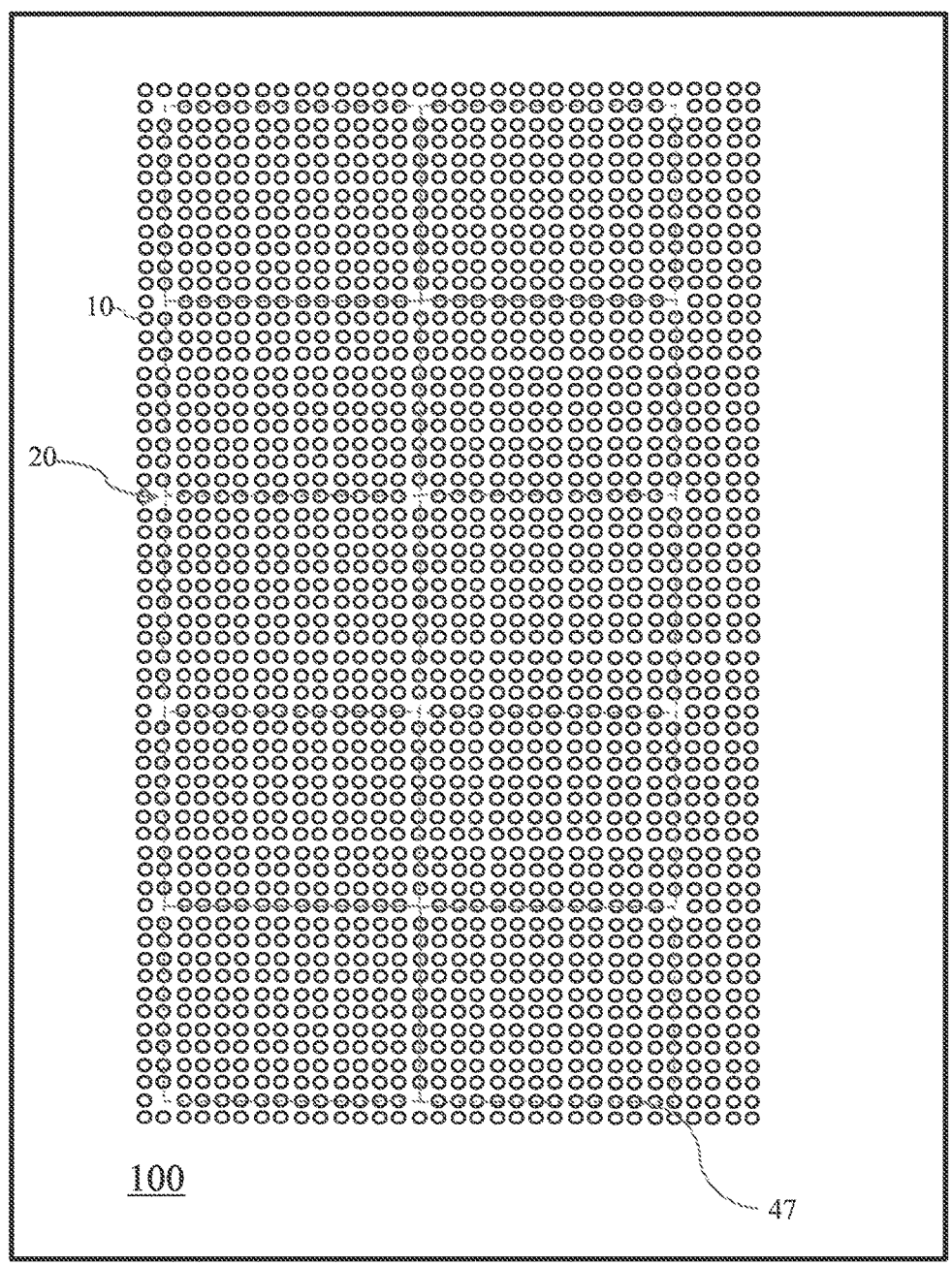

FIG. 6, which includes FIG. 6A-6B, illustrates a semiconductor structure after forming openings and removing the resist layers in the semiconductor substrate in accordance with an embodiment of the present invention. FIG. 6A illustrates a magnified cross-sectional view while FIG. 6B illustrates a top view.

Referring to FIGS. 6A and 6B, the resist layer 40 is removed exposing the underlying surface of the substrate 100. As illustrated in FIG. 6B, the second feature 47 is transferred from the mask 45 as pillars 20 on the substrate 100. In one or more embodiments, the spacing between the pillars 20 on the substrate 100 is about 20 µm to about 100 µm, and about 40 µm to about 60 µm in one embodiment.

In various embodiments, the openings 10 are spaced at a first pitch while the pillars 20 are spaced at a second pitch larger than the first pitch. In one or more embodiments, the first pitch is at least 50 times smaller than the second pitch. In one or more embodiments, the second pitch is about 20 times to about 150 times larger than the first pitch.

Figure 7:
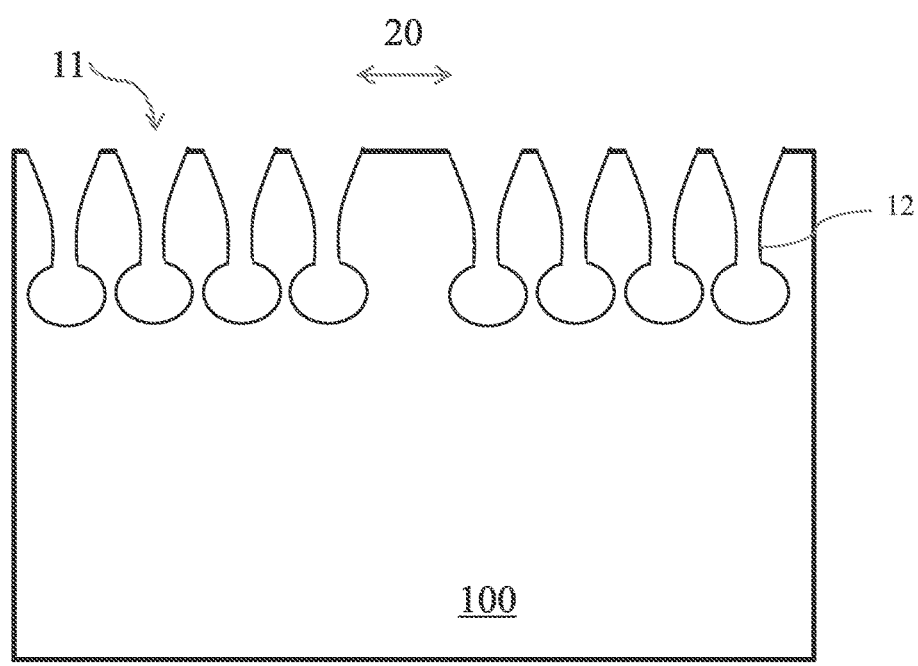
FIG. 7 illustrates a magnified cross-sectional view of a semiconductor structure during annealing in accordance with an embodiment of the present invention.

FIG. 7 illustrates a magnified cross-sectional view of a semiconductor structure during annealing in accordance with an embodiment of the present invention.

The semiconductor structure is annealed in a hydrogen atmosphere in various embodiments. As illustrated in FIG. 7, the openings 10 change shape during the initial stages of annealing because of the increase in surface diffusivity of the atoms on the exposed surfaces of the substrate 100 within the openings 10. In particular, the vertical sidewalls become rounded with the formation of a globular shaped opening 11 with a constricting neck region 12. The size, shape, and distance between adjacent globular shaped openings 11 are determined by the initial dimensions of the openings 10. For example, the globular shaped openings 11 are tightly spaced except in the region for the pillars 20.

Figure 8A:
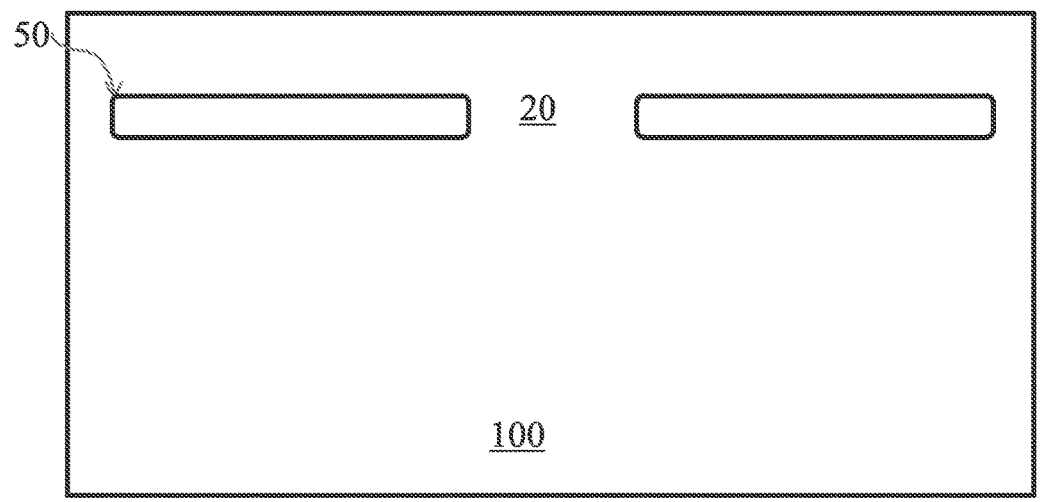
Figure 8B:
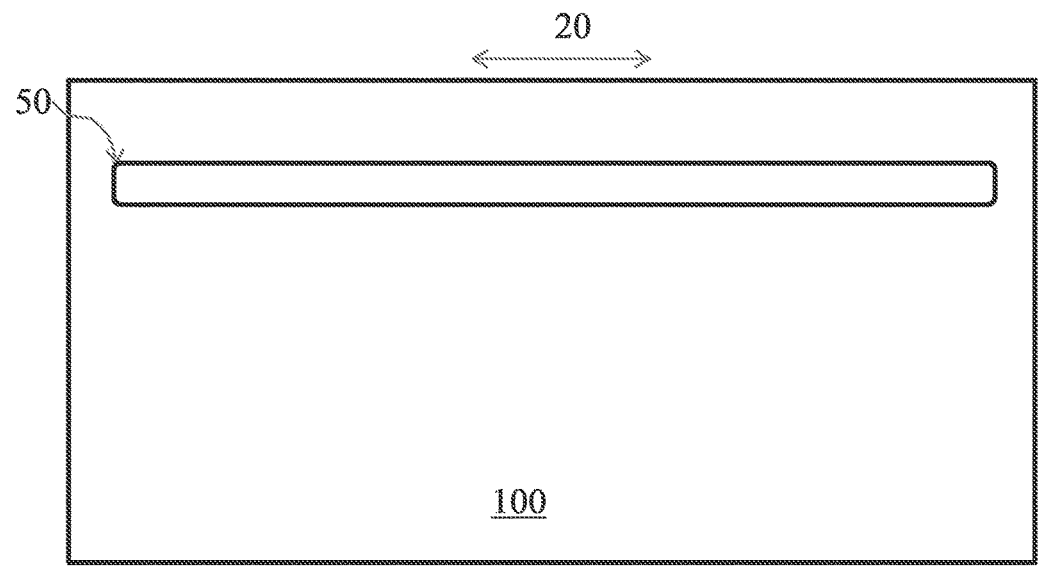
Figure 8C:
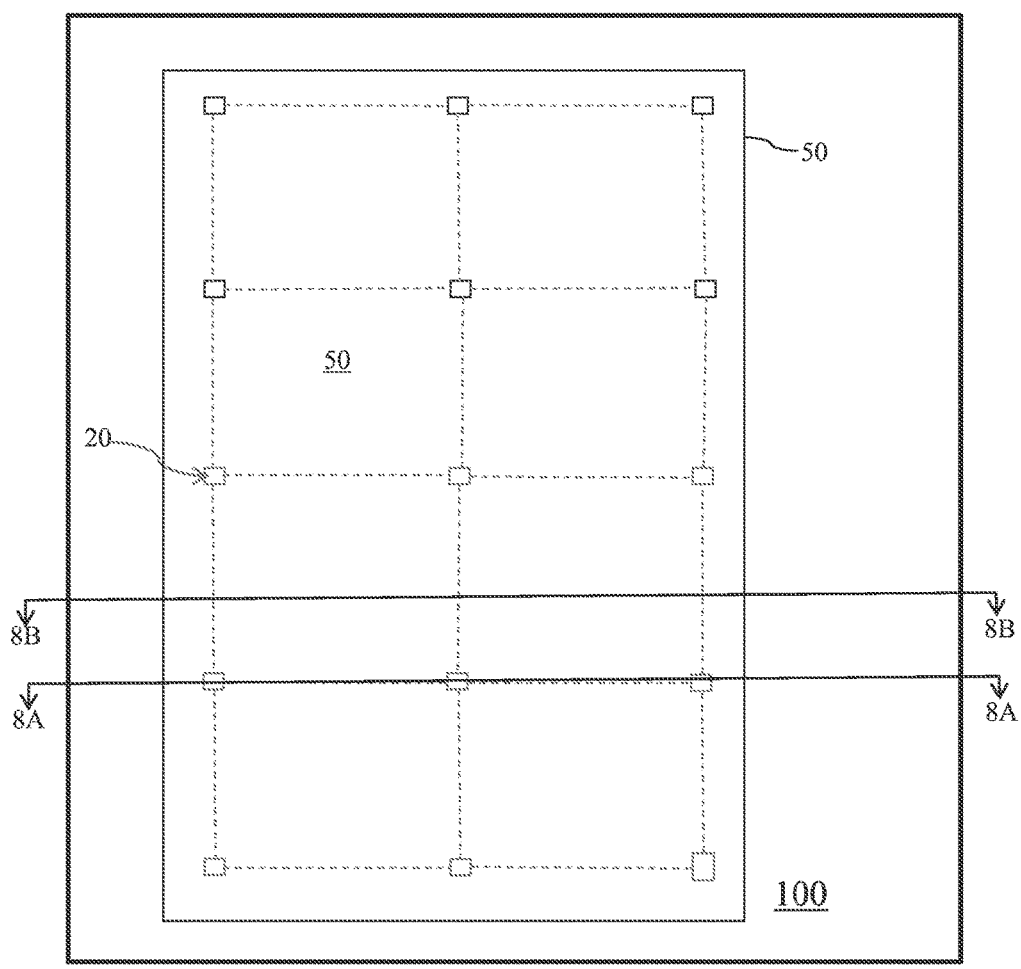

FIG. 8, which includes FIGS. 8A-8C, illustrates a semiconductor structure after annealing in accordance with an embodiment of the present invention. FIGS. 8A and 8B illustrate cross-sectional views while FIG. 8C illustrates a top view.

Eventually, upon further annealing, the globular shaped openings 11 constrict to form voids within the substrate 100. Further, depending on distance, adjacent globular shaped openings 11 (or voids) coalesce to form a single cavity 50. However, in the vicinity of the region for the pillars 20, the adjacent globular shaped openings 11 do not coalesce because of the large space between the neighboring globular shaped openings 11 thereby leaving behind the pillars 20. In various embodiments, after the annealing, the cavity 50 is fully embedded (enclosed) within the substrate 100. The cavity 50 may be filled with air, hydrogen, and other gases at a low pressure (<1 atm) depending on the annealing atmosphere.

In one or more embodiments, the semiconductor structure is annealed at about 900° C. to about 1150° C. In one or more embodiments, the semiconductor structure is annealed at about 1050° C. to about 1150° C.

In one or more embodiments, the semiconductor structure is annealed at about 1 Torr to about 760 Torr. In one or more embodiments, the semiconductor structure is annealed at about 1 Torr to 50 Torr. In one or more embodiments, the semiconductor structure is annealed at about 10 Torr to about 30 Torr.

In one or more embodiments, the semiconductor structure is annealed for about 1 min to about 60 mins. In one or more embodiments, the semiconductor structure is annealed for about 5 mins to about 15 mins.

The cavity 50 may be used for forming any type of structure. For example, in one embodiment, a transistor may be formed over the substrate 100. The cavity 50 may be used for changing the stress of the surface of the substrate 100. In an alternative embodiment, the cavity 50 may be filled with another embodiment. In a further embodiment, the cavity 50 may be used to form different types of micro-electromechanical system devices. Further processing may be performed to form a subsequent semiconductor device.

FIG. 9-12 illustrate a further embodiment of forming a semiconductor structure having a multi-level cavity structure.

Figure 9:
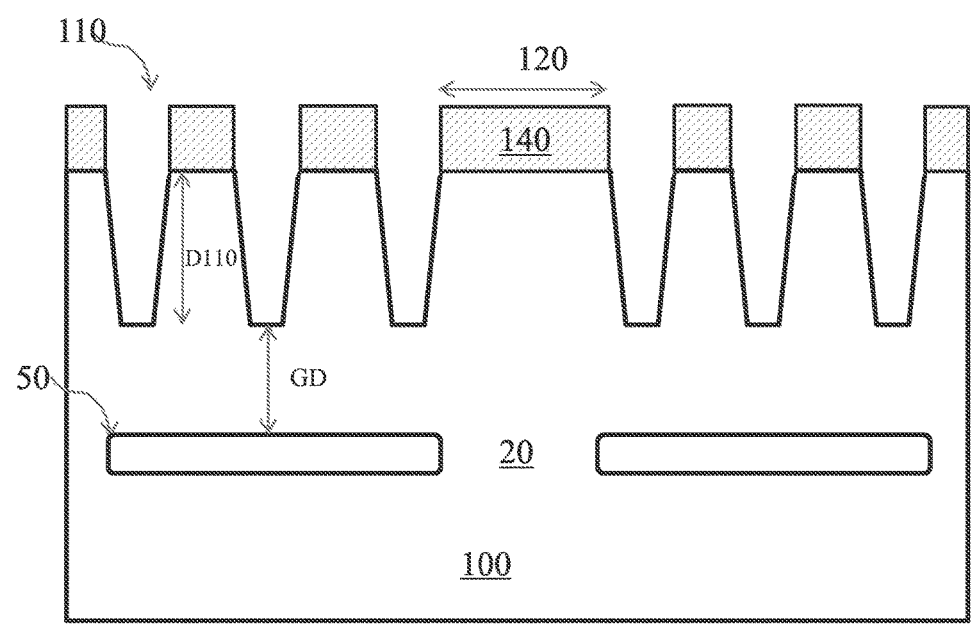
FIG. 9 illustrates a cross-sectional view of a semiconductor structure after forming second level openings in accordance with an embodiment of the invention.

FIG. 9 illustrates a cross-sectional view of a semiconductor structure after forming second level openings in accordance with an embodiment of the invention.

In this embodiment, processing may proceed as described in FIG. 4-8. After forming the cavity 50 as described with respect to FIG. 8, a second level resist layer 140 may be deposited and patterned with a second level mask having patterns for the second level cavity and second level pillars.

Using the patterned second level resist layer 140 as an etch mask, second openings 110 may be formed as described previously for forming openings 10. The depth of the second openings 110 (D110) is controlled to ensure that they are separated from the cavity 50 by a sufficient guard depth GD. The guard depth GD is at least 0.1 µm in various embodiments, and about 1 µm to about 5 µm in one embodiment. The guard depth GD may be used to avoid coalesce between the cavity 50 and the second level cavity being formed.

The second openings 110 may be formed at a tighter pitch than the opening 10, for example, to adjust for the narrower cross sectional area and/or depth of the second openings 110.

Figure 10:
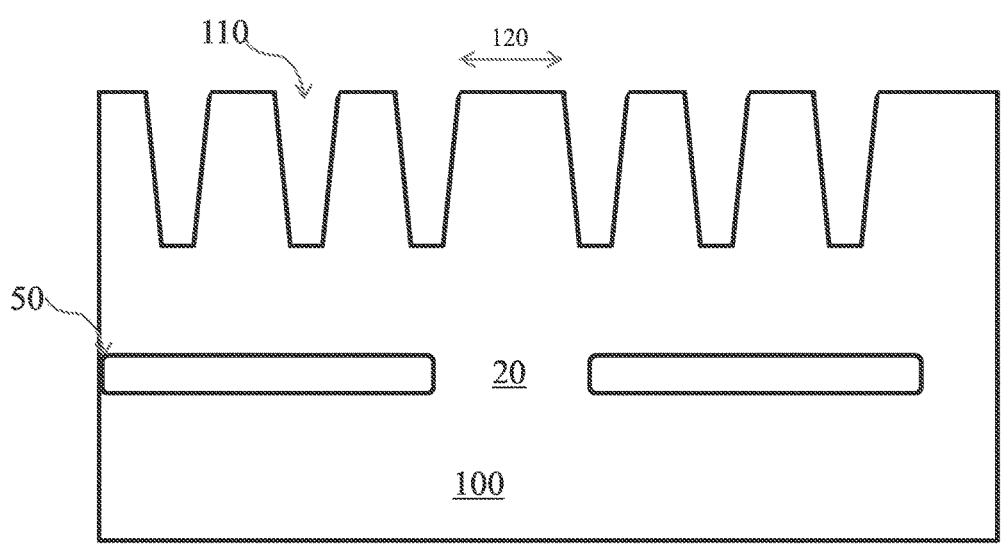
FIG. 10 illustrates a cross-sectional view of a semiconductor structure after removing the resist layer in accordance with an embodiment of the invention.

FIG. 10 illustrates a cross-sectional view of a semiconductor structure after removing the resist layer in accordance with an embodiment of the invention.

Figure 11:
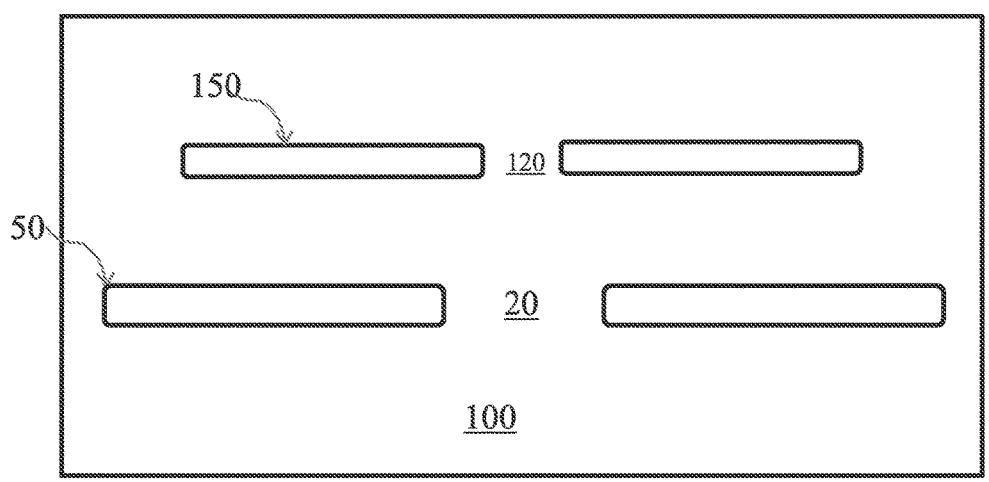
FIG. 11 illustrates a cross-sectional view of a semiconductor structure after annealing to form a second level cavity in accordance with an embodiment of the invention.

FIG. 11 illustrates a cross-sectional view of a semiconductor structure after annealing to form a second level cavity in accordance with an embodiment of the invention. As illustrated in FIG. 11, a hydrogen anneal may be performed as described in prior embodiment. The hydrogen anneal in this embodiment may be performed at a different annealing condition than the prior embodiment.

Figure 12:
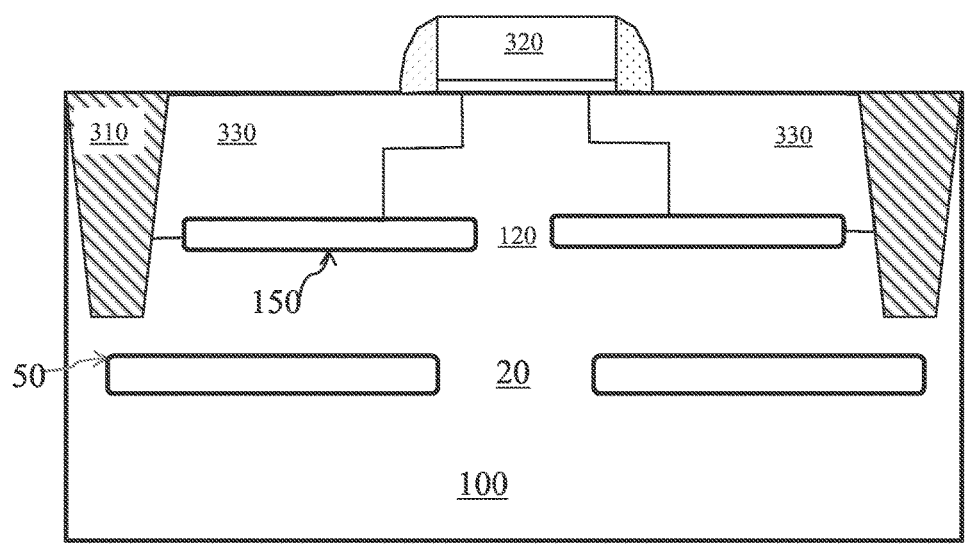
FIG. 12 illustrates a cross-sectional view of a semiconductor structure after subsequent processing in accordance with an embodiment of the invention.

FIG. 12 illustrates a cross-sectional view of a semiconductor structure after subsequent processing in accordance with an embodiment of the invention.

In one embodiment, a transistor structure may be fabricated over the multi-level cavity. This embodiment may be performed directly over the cavity 50 illustrated in FIG. 8 in another embodiment. Accordingly, isolation regions 310, a gate stack 320, and doped regions 330 such as source/drain regions may be formed over the substrate 100. After finishing active device regions over the substrate 100, back end metallization layers may be formed over the substrate 100.

Figure 13A:
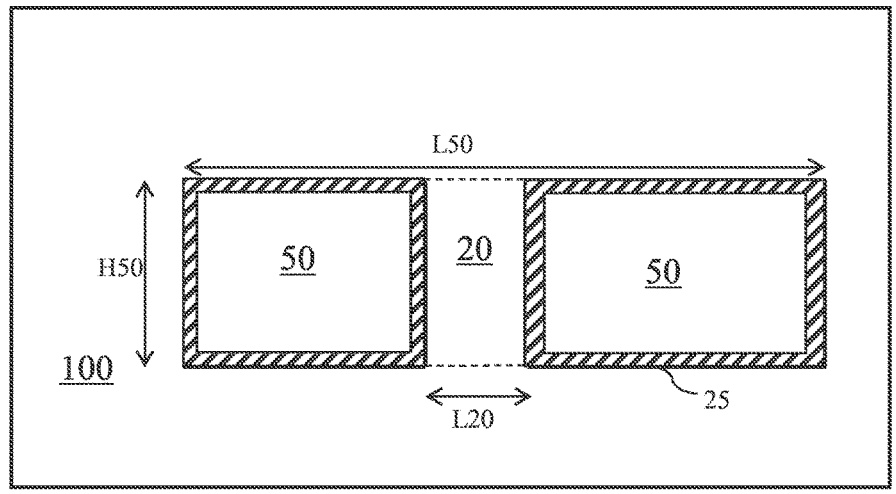
Figure 13B:
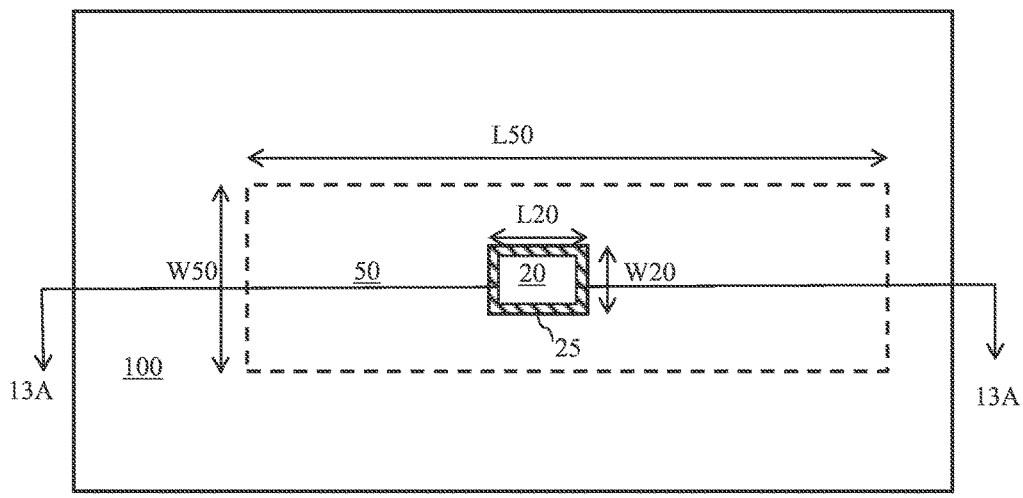
Figure 13C:
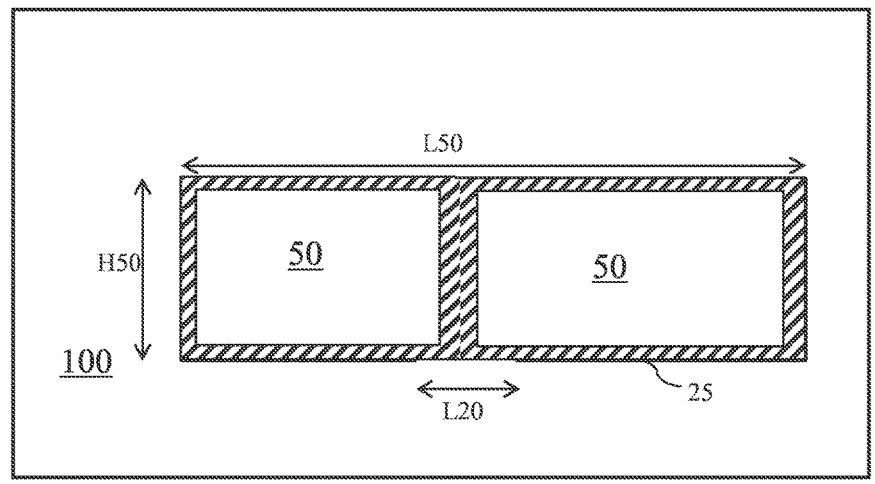
Figure 13D:
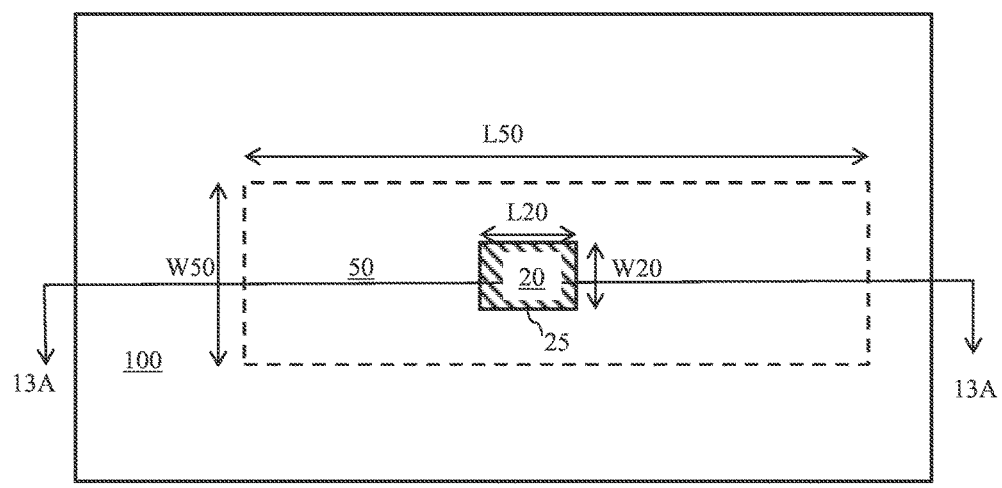

FIG. 13, which includes FIGS. 13A-13D, illustrates a semiconductor cavity having pillars with a dielectric liner in accordance with an alternative embodiment of the present invention. FIGS. 13A and 13C illustrate a cross-sectional view and FIGS. 13B and 13D illustrate a top view.

FIGS. 13A and 13B illustrate a first embodiment while FIGS. 13C and 13D illustrate an alternative embodiment.

As illustrated in FIG. 13A, in some embodiments, after or during formation of the cavity 50, the surfaces of the cavity 50 may be exposed to an oxidizing or nitrogen atmosphere. For example, in some embodiments, an oxidizing ambient may be used along with the hydrogen annealing to form a liner 25 covering the pillars 20 and the surfaces of the cavity 50. The liner 25 may comprise a silicon oxide such as a thermal oxide in one embodiment. In an alternative embodiment, the liner 25 may comprise a nitride such as a thermal nitride. In an alternative embodiment, a liner 25 may be formed by opening the cavity 50 in a subsequent process step after forming the cavity 50.

In the alternative embodiment illustrated in FIGS. 13C and 13D, the oxidation may completely oxidize the pillars 20 thereby forming dielectric pillars 20. Thus, the pillars 20 may not only help to structurally support the cavity 20 but may also prevent the conduction between the ceiling of the cavity 50 with the floor of the cavity 50 preventing unwanted parasitic effects.

Figure 14:
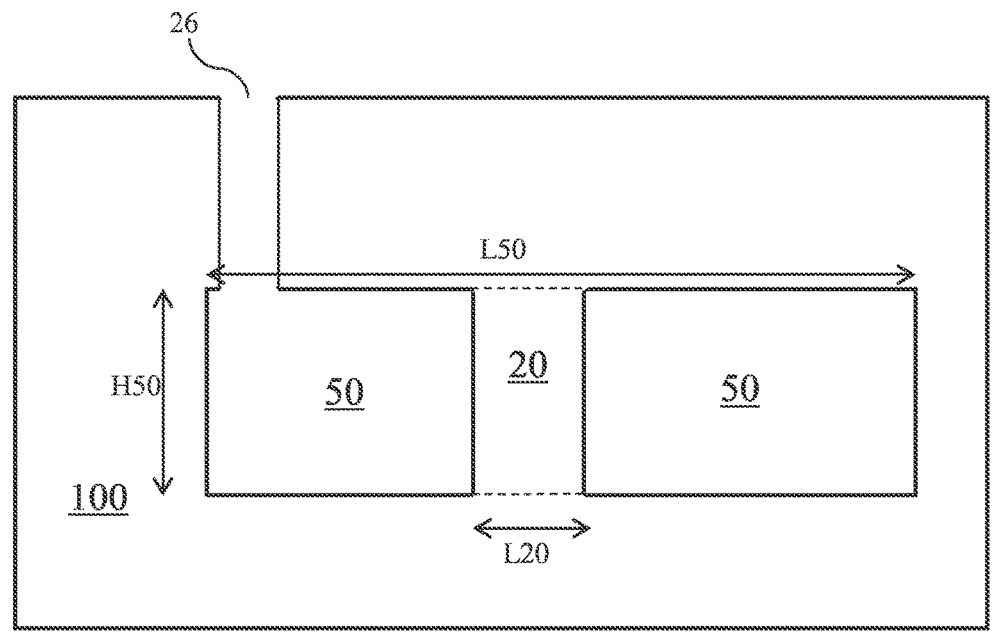
FIG. 14 illustrates a cross-sectional view of a semiconductor structure having pillars supporting the cavity and a further opening connecting the cavity to a top surface of the substrate in accordance with an alternative embodiment of the present invention.

FIG. 14 illustrates a cross-sectional view of a semiconductor structure having pillars supporting the cavity and a further opening connecting the cavity to a top surface of the substrate in accordance with an alternative embodiment of the present invention.

As illustrated in FIG. 14, after forming the cavity 50 with pillars 20, an opening 26 may be formed to open up the cavity 50. In some embodiments, the cavity 50 may now be oxidized as described in prior embodiments.

Figure 15A:
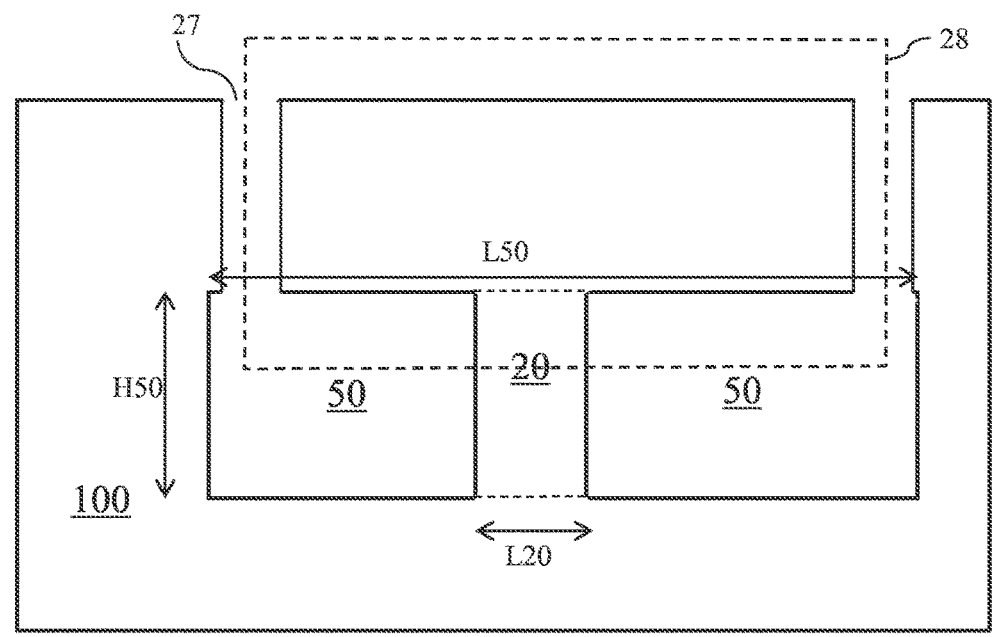
Figure 15B:
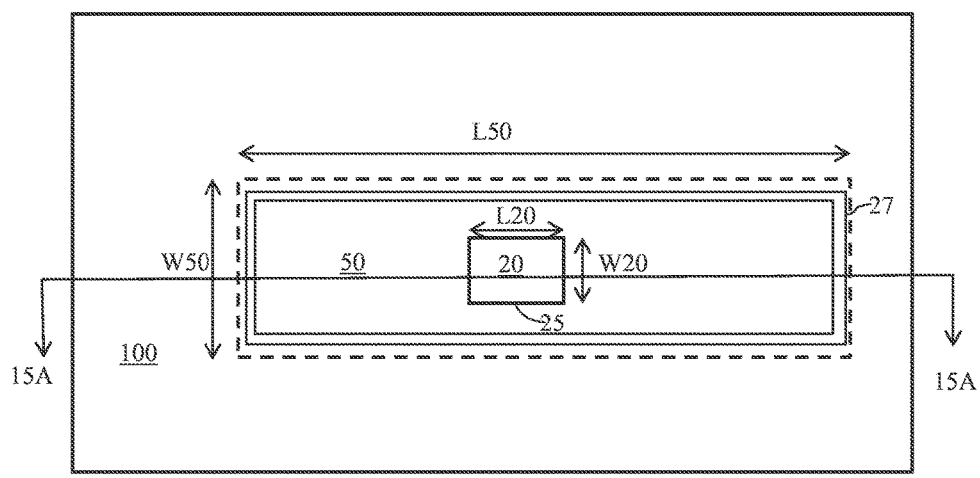

FIG. 15, which includes FIGS. 15A and 15B, illustrates a semiconductor structure having pillars supporting the cavity and a further trench opening around the cavity so as to separate the substrate portion above the cavity in accordance with an alternative embodiment of the present invention, wherein FIG. 15A illustrates a cross-sectional view and FIG. 15B illustrates a top view.

After forming the cavity 50, the substrate portion above the cavity 50 may be separated as described in this embodiment. As illustrated in FIG. 15A, in another alternative embodiment, a trench opening 27 into the cavity 50. The trench opening 27 may be formed around the cavity 50 such that the cavity 50 may be separated from the rest of the substrate 100 except for the pillars 20. The pillars 20 may be cleaved to remove the substrate portion 28 above the cavity 50 out of the substrate 100.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1-15 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a plurality of openings in a semiconductor substrate, the plurality of openings being separated from each other by one of ridge regions of the semiconductor substrate, wherein the ridge regions are wider at preselected locations and at a central region forming a first pattern; and
    annealing the semiconductor substrate to convert the plurality of openings to a first cavity, the central region to a central pillar, the preselected locations to a plurality of support pillars, the first cavity disposed under a portion of the semiconductor substrate,
    wherein the ridge regions are wider at second preselected locations, wherein the annealing converts the second preselected locations into a plurality of second pillars, the plurality of second pillars arranged around the central pillar in a second pattern different from the first pattern.

2. The method of claim 1, wherein the annealing forms a second cavity adjacent the first cavity.

3. The method of claim 2, further comprising forming a second pillar for supporting the second cavity.

4. The method of claim 1, further comprising forming a device over the semiconductor substrate after annealing to form the first cavity.

5. A method of forming a semiconductor device, the method comprising:
    forming a plurality of first openings in a semiconductor substrate, the plurality of first openings being separated from each other by one of first ridge regions of the semiconductor substrate, wherein the first ridge regions are wider at preselected locations and at a central region forming a first pattern;
    annealing the semiconductor substrate to convert the plurality of first openings to a first cavity, the central region to a central pillar, the preselected locations to a plurality of support pillars, the first cavity disposed under a portion of the semiconductor substrate; and
    forming a plurality of second openings in the semiconductor substrate, wherein a depth of the plurality of second openings is controlled to ensure that a bottom surface of the plurality of second openings are separated from a ceiling of the first cavity by a predetermined guard depth.

6. The method of claim 5, wherein the ridge regions are wider at second preselected locations, wherein the annealing converts the second preselected locations into a plurality of second pillars, the plurality of second pillars arranged around the central pillar in a second pattern different from the first pattern.

7. The method of claim 5, wherein the annealing forms a second cavity adjacent the first cavity.

8. The method of claim 7, further comprising forming a second pillar for supporting the second cavity.

9. The method of claim 5, further comprising forming a device over the semiconductor substrate after annealing to form the first cavity.

10. The method of claim 5, wherein the predetermined guard depth is set to at least 0.1 µm.

11. The method of claim 5, wherein the predetermined guard depth is set to between about 1 µm to about 5 µm.

12. The method of claim 5, wherein the plurality of second openings are formed at a tighter pitch than the plurality of first openings.

13. The method of claim 5, further comprising annealing the semiconductor substrate to convert the plurality of second openings to a second cavity above the first cavity, the second cavity disposed under a portion of the semiconductor substrate.

14. The method of claim 13, wherein the predetermined guard depth is set to prevent coalescing of the first cavity and the second cavity.

* * * * *